US008665641B2

(12) United States Patent
Ito

(10) Patent No.: US 8,665,641 B2
(45) Date of Patent: Mar. 4, 2014

(54) SEMICONDUCTOR DEVICE

(75) Inventor: Shin Ito, Tokyo (JP)

(73) Assignee: Elpida Memory, Inc., Tokyo (JP)

(*) Notice: Subject to any disclaimer, the term of this patent is extended or adjusted under 35 U.S.C. 154(b) by 199 days.

(21) Appl. No.: 13/137,031

(22) Filed: Jul. 15, 2011

(65) Prior Publication Data
US 2012/0020149 A1 Jan. 26, 2012

(30) Foreign Application Priority Data

Jul. 23, 2010 (JP) ................................. 2010-165538

(51) Int. Cl.
*G11C 11/00* (2006.01)
(52) U.S. Cl.
USPC .......................................... 365/163; 365/148
(58) Field of Classification Search
USPC ............. 365/46, 94, 100, 113, 129, 148, 163; 257/2–5, 9, 296, E31.047, E27.006; 438/29, 95, 96, 166, 259, 365, 482, 438/486, 597; 977/754
See application file for complete search history.

(56) References Cited

U.S. PATENT DOCUMENTS

| 2003/0058723 | A1* | 3/2003 | Vali et al. ....................... 365/205 |
| 2004/0085840 | A1* | 5/2004 | Vali et al. ....................... 365/202 |
| 2005/0045919 | A1* | 3/2005 | Kaeriyama et al. ........... 257/211 |
| 2006/0034142 | A1* | 2/2006 | Ooishi et al. ............. 365/230.06 |
| 2006/0146634 | A1* | 7/2006 | Osada et al. ................... 365/226 |
| 2008/0002506 | A1* | 1/2008 | Osada et al. ................... 365/226 |
| 2008/0019195 | A1* | 1/2008 | Ooishi et al. ............. 365/189.15 |
| 2008/0285336 | A1* | 11/2008 | Osada et al. ................... 365/163 |
| 2010/0054020 | A1* | 3/2010 | Ueda .............................. 365/148 |

FOREIGN PATENT DOCUMENTS

JP          2010-49792 A          3/2010

* cited by examiner

*Primary Examiner* — Harry W Byrne
(74) *Attorney, Agent, or Firm* — McGinn Intellectual Property Law Group, PLLC

(57) ABSTRACT

A memory cell changes a potential of a bit line to a discharge potential from a precharge potential in correspondence with held data. A sense amplifier precharges a bit line by a precharge circuit, compares potential at a decision point linked with the potential of the bit line with a decision threshold and outputs a comparison result by an output circuit, and sets the potential at the decision point at a time of precharging in correspondence with the decision threshold. A capacitor element connects between the bit line and an input end of the output circuit. A potential setting circuit enables setting of an input end of the output circuit forming a decision point, to a prescribed potential between a precharge voltage of the bit line and the decision threshold at a time of precharging the bit line. Operating range of memory function is enlarged.

20 Claims, 7 Drawing Sheets

SEMICONDUCTOR DEVICE

TECHNICAL FIELD

REFERENCE TO RELATED APPLICATION

This application is based upon and claims the benefit of the priority of Japanese patent application No. 2010-165538, filed on Jul. 23, 2010, the disclosure of which is incorporated herein in its entirety by reference thereto. The present invention relates to a semiconductor device, and in particular relates to a semiconductor device provided with a resistance change memory.

BACKGROUND

As an example of a resistance change memory, a phase change memory is a device that uses a property of transitioning between an amorphous state and a crystalline state by adding electrically generated heat to a chalcogenide material (Ge, Sb, Te), to perform storage. In a cell configured by a phase change memory, in a case of causing a phase change by Joule heat by an electrical current to carry out writing, when there is a transition from a low resistance state (set state, crystalline state) to a high resistance state (reset state, amorphous state), a large current is made to flow for a short time. Conversely, in a case of a transition from a high resistance state (reset state, amorphous state) to a low resistance state (set state, crystalline state), a relatively small current must be made to flow for a long time. In this regard, in a case of performing reading, a small current in comparison to a case of writing may be made to flow.

A semiconductor device provided with this type of phase change memory is disclosed in Patent Document 1. The semiconductor device is provided with a bit line selector wherein a line selected from a plurality of bit lines is connected to a bit line on a sense amplifier side, to precharge the bit line of the sense amplifier side to a desired level. Furthermore there is also provided a sense amplifier that amplifies and outputs a signal of a bit line on the sense amplifier side. This sense amplifier detects when potential of the bit line on the sense amplifier side, which has once been precharged, drops in accordance with a state (high resistance, low resistance) of a phase-change memory via the bit line, and determines data according to whether this potential is higher or lower than a reference level.

[Patent Document 1]
JP Patent Kokai Publication No. JP2010-49792A

SUMMARY

The entire disclosure of Patent Document 1 is incorporated herein by reference thereto. The following analysis is given by the present invention.

Patent Document 1 discloses an arrangement of a precharge transistor wherein a precharge transistor precharges bit lines on a memory array side and bit lines on a sense amplifier side for a desired period to a desired level (paragraph 0039). The sense amplifier operates to output a comparative result by comparing a bit line level on the sense amplifier side and a reference level VREF, at a time of reading. With a precharge potential taken to be VR, and an NMOS transistor where a precharge transistor has a threshold Vt, a precharge potential Vpre of a bit line on the sense amplifier side is expressed as follows.

$$V\text{pre} = (VR - Vt)$$

If respective potential drops at a time of high resistance and of low resistance for a memory cell are $\Delta V1$ and $\Delta V2$, by detection of
H level in a case of $(VR-Vt)-\Delta V1 > VREF$, and
L level in a case of $(VR-Vt)-\Delta V2 < VREF$,
the sense amplifier distinguishes H/L of read data. However, under a condition such that inequality signs of both are the same direction, it is not possible to distinguish H/L for the data, so that an intrinsic function of memory cannot be realized.

However, it is known that Vt of a MOS transistor has what is called PVT (Process, Voltage, Temperature) dependency, and changes in accordance with operating environment of the MOS transistor. Therefore, Vt in the abovementioned expression is not a constant value but changes in accordance with the operating environment, and if the change is large, there is a risk that the inequality sign directions will become the same irrespective of $\Delta V1$ and $\Delta V2$, that H/L for the data cannot be distinguished, and the memory function will be lost.

In response to the abovementioned type of problem, the inventors in the present application considered that it is possible to handle change of operating environment by a configuration that gives consideration to amount of change in Vt, with regard to precharging a bit line, and arrived at an idea for the present invention.

In a first aspect of the present invention a semiconductor device is provided with a bit line, a memory cell that changes a potential of the bit line to a discharge potential from a precharge potential in correspondence with held data, and a sense amplifier that precharges the bit line and outputs output data in response to a result of comparing potential at a decision point linked with the potential of the bit line and a decision threshold. The sense amplifier sets the potential of the decision point in correspondence with the decision threshold at a time of precharging.

In a second aspect of the present invention, a semiconductor device is provided with a memory cell array where memory cells configured to include a resistance change element are disposed in matrix form, a bit line commonly connected to one end of a plurality of the memory cells in a column direction of the memory cell array, and a sense amplifier that precharges the bit line, determines a potential at a decision point linked to a potential of the bit line that changes according to a state of a memory cell after a prescribed time has passed from ending precharging, and outputs output data expressing whether or not the potential of the decision point is greater than or equal to a decision threshold. The sense amplifier sets the potential of the decision point in correspondence with the decision threshold in a case where the bit line is precharged.

In a third aspect, there is provided a semiconductor device comprising: a first terminal; a precharge circuit including a first transistor of a first conductive type and a second transistor of a second conductive type connected in series between first and second voltage terminals to generate a first potential a level of which depends on the first and second transistors, the precharge circuit charging the first terminal at the first potential; a memory cell changing a potential of the first terminal from the first potential to a second potential a level of which depends on a state of the memory cell; and a sense inverter circuit including a third transistor of the first conductive type and a fourth transistor of the second conductive type connected in series between the first and second voltage terminals. Each control gate of the first and second transistors is coupled to the first terminal. The sense inverter circuit outputs first data when the level of the second potential of the first terminal is higher than a sense threshold potential a level of which depends on the third and fourth transistors and second data when the level of the second potential of the first terminal is lower than the sense threshold potential.

In a fourth aspect of the present invention, there is provided a method comprising: setting a first node at an initial potential; driving a second node in response to a first signal to be output to change a potential of the second node, change of the potential of the second node causing the first node to change from the initial potential to a second potential; and comparing the second potential with a reference potential to produce a second signal.

The meritorious effects of the present invention are summarized as follows. According to the present invention, even in a case where a decision threshold changes with change in operating environment of a semiconductor device, precharge potential follows accordingly, and it is possible to enlarge an operating range of memory function.

PREFERRED MODES

Figure 1:
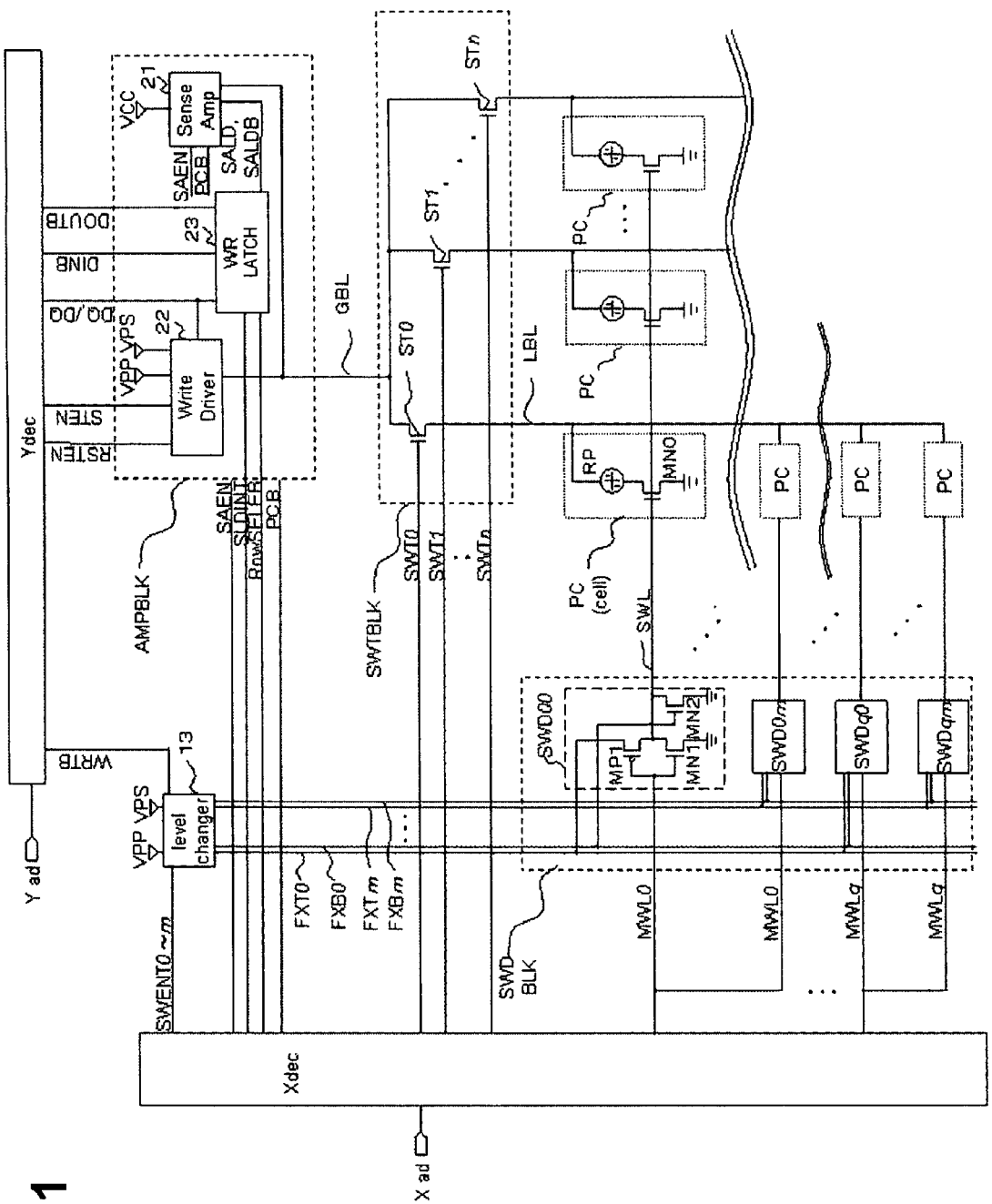
FIG. 1 is a block diagram showing a configuration of a semiconductor device according to a first exemplary embodiment of the present invention.

In the following preferred modes, the symbols referring to the drawings mentioned herein, are intended to be merely of illustrative purpose for better understanding without restrictive intent to the configurations shown by the drawings. According to a mode of the present invention a semiconductor device is provided with bit lines (corresponding to LBL and GBL in FIG. 1), memory cells (PC in FIG. 1) that change a potential of a bit line to a discharge potential from a precharge potential in correspondence with held data, and a sense amplifier (21 in FIG. 1) that precharges a bit line and outputs output data in response to a result of comparing a potential at a decision point linked with the potential of the bit line and a decision threshold, wherein the sense amplifier has a function of setting the potential of the decision point in correspondence with the decision threshold at a time of precharging.

According to another mode of the present invention, a semiconductor device is provided with a memory cell array where memory cells (PC in FIG. 1) configured to include a resistance change element (equivalent to RP in FIG. 1) are disposed in matrix form, bit lines (corresponding to LBL and GBL in FIG. 1) commonly connected to one end of plural memory cells in a column direction of the memory cell array, and a sense amplifier (21 in FIG. 1) that precharges a bit line, determines a potential of a decision point linked to a potential of a bit line that changes according to a state of a memory cell, after a prescribed time has passed from ending precharging, and outputs output data expressing whether or not the potential of the decision point is greater than or equal to a decision threshold, wherein the sense amplifier has a function of setting the potential of the decision point in correspondence with the decision threshold in a case where the bit line is precharged.

In the semiconductor device, the sense amplifier is provided with a precharge circuit (corresponding to MP12 in FIG. 2) that precharges the bit line (corresponding to GBL in FIG. 2), an output circuit (corresponding to MN11 and MP14 in FIG. 2) that outputs output data after a prescribed time has passed from ending precharging, a capacitor element (C1 in FIG. 2) connected between the bit line and an input end of the output circuit, and a potential setting circuit (corresponding to MN12, MP13, MP15 and MP16 in FIG. 2) that enables setting the input end of the output circuit to a prescribed potential between a precharge voltage of the bit line and the decision threshold, at a time of precharging the bit line, wherein the decision point may be the input end of the output circuit to which one end of the capacitor element is connected.

In the semiconductor device, the decision threshold may be a logic threshold at the input end of the output circuit.

In the semiconductor device, the output circuit may include an output CMOS inverter circuit (MN11 and MP14 in FIG. 2), and an input end of the output circuit may be an input end of the output CMOS inverter circuit.

In the semiconductor device, the potential setting circuit may include a switch circuit (corresponding to MP13 in FIG. 2) that is ON at a time of precharging the bit line, enabling a supply of the prescribed potential to the input end of the output circuit, and is OFF after the precharging of the bit line is ended.

In the semiconductor device, the potential setting circuit may be provided with a setting CMOS inverter circuit (corresponding to MN12 and MP15 in FIG. 2) that outputs a prescribed potential from an output end, and also connects an input end and the output end, wherein a ratio of the size of an NMOS transistor (MN11 in FIG. 2) in the output CMOS inverter circuit with respect to the size of a PMOS transistor (MP14 in FIG. 2) in the output CMOS inverter circuit, is smaller than a ratio of the size of an NMOS transistor (MN12 in FIG. 2) in the setting CMOS inverter circuit with respect to the size of a PMOS transistor (MP15 in FIG. 2) in the setting CMOS inverter circuit.

In the semiconductor device, the output circuit comprises first and second NMOS transistors (MN14 and MN15 in FIG. 6) connected in parallel between a ground side of the output CMOS inverter circuit and ground, wherein a gate of the first NMOS transistor is connected to an input end of the output CMOS inverter circuit, and the second NMOS transistor is OFF at a time of precharging the bit line; and the potential setting circuit may be configured as the output CMOS inverter circuit that makes a short circuit between an input end and an output end at a time of precharging the bit line, to have the input end at a prescribed potential.

In the semiconductor device, the capacitor element may be configured by a capacitor between a MOS transistor gate and a diffusion layer.

According to the abovementioned semiconductor device, in the sense amplifier circuit, since the potential of the decision point at a time of precharging is set in correspondence with a decision threshold, even in a case where the decision threshold changes with change in operating environment of the semiconductor device, precharge potential follows accordingly, and it is possible to enlarge an operating range of memory function.

A detailed description is given below in accordance with exemplary embodiments, making reference to the drawings.

First Exemplary Embodiment

FIG. 1 is a block diagram showing a configuration of a semiconductor device according to a first exemplary embodiment of the present invention. In FIG. 1, the semiconductor device is provided with an X decoder Xdec, a Y decoder Ydec, a sub-word unit SWDBLK, a level shift circuit 13, an amplifier unit AMPBLK, a switch unit SWTBLK, and memory cells PC. The memory cells PC are disposed in a matrix form at intersection points of respective local bit lines LBL driven by the switch unit SWTBLK and sub-word lines SWL driven by the sub-word unit SWDBLK.

In FIG. 1, the X decoder Xdec receives and decodes a row address signal Xad, and outputs signals SWENTj (j=0 to m) to the level shift circuit 13, an activation signal SAEN, a signal SLDINT, a signal RowSELEB, and a precharge signal PCB to the amplifier unit AMPBLK, signals SWTi (i=0 to n) to the switch unit SWTBLK, and main word line signals MWLi (i=0 to q) to the sub-word unit SWDBLK.

The Y decoder Ydec receives and decodes a column address signal Yad, and outputs a signal WRTB to the level shift circuit 13, and a reset signal RSTEN, a set signal STEN, a signal DINB, and a signal DOUTB to the amplifier unit AMPBLK. In addition, signals DQ and DQB are received from the amplifier unit AMPBLK.

The memory cells PC include a phase change element RP and a memory cell transistor MN0 connected in series, between a local bit line LBL and a ground terminal (ground). The phase change element RP may be a resistive memory element (RRAM). The memory cell transistor MN0 has a gate (control electrode) connected to a sub-word line SWL, a source connected to ground, and a drain connected to a local bit line LBL via the phase change element RP.

The sub-word unit SWDBLK is provided with sub-word line drive circuits SWDij (i=0 to q, j=0 to m). A sub-word line drive circuit SWDij is provided with NMOS transistors MN1 and MN2, and a PMOS transistor MP1. The NMOS transistor MN1 and the PMOS transistor MP1 have gates commonly connected to a main word line signal MWLi. The NMOS transistor MN1 has a source connected to ground and a drain connected to a sub-word line SWL. The PMOS transistor MP1 has a source that is given a sub-word selection line signal FXTj, and a drain connected to the sub-word line SWL. The NMOS transistor MN2 has a source connected to ground, a drain connected to the sub-word line SWL, and a gate that is given a sub-word selection line signal FXBj.

The sub-word unit SWDBLK configured in this way receives the main word line signals MWLi (i=0 to q) obtained by decoding part of the row address signal Xad and sub-word selection line signals FXTj (j=0 to m) and FXBj, and outputs the sub-word line signal SWL. Here, a potential of the sub-word line signal SWL is controlled to be VPP or VPS, by the level shift circuit 13.

In FIG. 1, the switch unit SWTBLK is configured by switch elements STi (i=0 to n) in order to connect a plurality of local bit lines LBL and a global bit line GBL; one end of a switch element STi is connected to the global bit line GBL, and the other end is connected to a local bit line LBL. In the switch element STi, opening and closing are controlled according to the signal SWTi obtained by decoding a part of the row address signal Xad.

The amplifier unit AMPBLK performs reading/writing of data from the global bit line GBL. The amplifier unit AMP-BLK includes a sense amplifier circuit (Sense Amp) 21 that performs reading and amplification of read data, a write driver circuit (Write Driver) 22 that controls write data of a phase change memory, and a write read latch circuit (WR latch) 23 that holds read/write data of the phase-change memory.

The sense amplifier circuit 21 precharges the global bit line GBL in a case where the precharge signal PCB is active, and also sets a potential of an internal decision point to a desired value. Furthermore, in a case where the activation signal SAEN is active, the sense amplifier circuit 21 amplifies the data from the global bit line GBL, and outputs to the write read latch circuit 23 as signals SALD and SALDB. It is to be noted that the activation signal SAEN is active in correspondence with the row address signals Xad.

When a phase change element RP that is a target of selection is in a reset state (corresponding to /DQ=H), the write driver circuit 22, with the reset signal RSTEN as H and the set signal STEN as L, supplies VPP to the global bit line GBL. On the other hand, when the phase change element RP is in a set state (corresponding to DQ=H), with the set signal STEN as H and the reset signal RSTEN as L, VPS is supplied to the global bit line GBL. That is, the configuration is such that when the phase change element RP is in a reset state, VPP, which is a high voltage, is supplied, and when the phase change element RP is in a set state, VPS, which is a lower voltage, is supplied. Respective supply times (pulse widths) of VPP and VPS correspond to activation times of the reset signal RSTEN and the set signal STEN.

With regard to the write read latch circuit 23, when signals SLDINT=H and RowSELEB=L, obtained by respectively decoding a part of the row address signal Xad, are each in an activation state (selection state), signals SALD and SALDB, which are complementary data read from the sense amplifier circuit 21, are latched, as signals DQL and DQBL. When in a read mode, DOUTB=L and DINB=H, and in response to this, latched data are read as respective signals DQ and DQB.

On the other hand, when in a write mode, DOUTB=H and DINB=L, and signals DQ and DQB are respectively overwritten in the latch circuit. When in a write mode, the write driver circuit 22 writes data to the phase change element RP, and also rewrites data of the write read latch circuit 23. In a case where a read mode comes subsequent to the write mode, by this type of action, it is possible to read data from the write read latch circuit 23 without re-accessing the phase change element RP.

Figure 2:
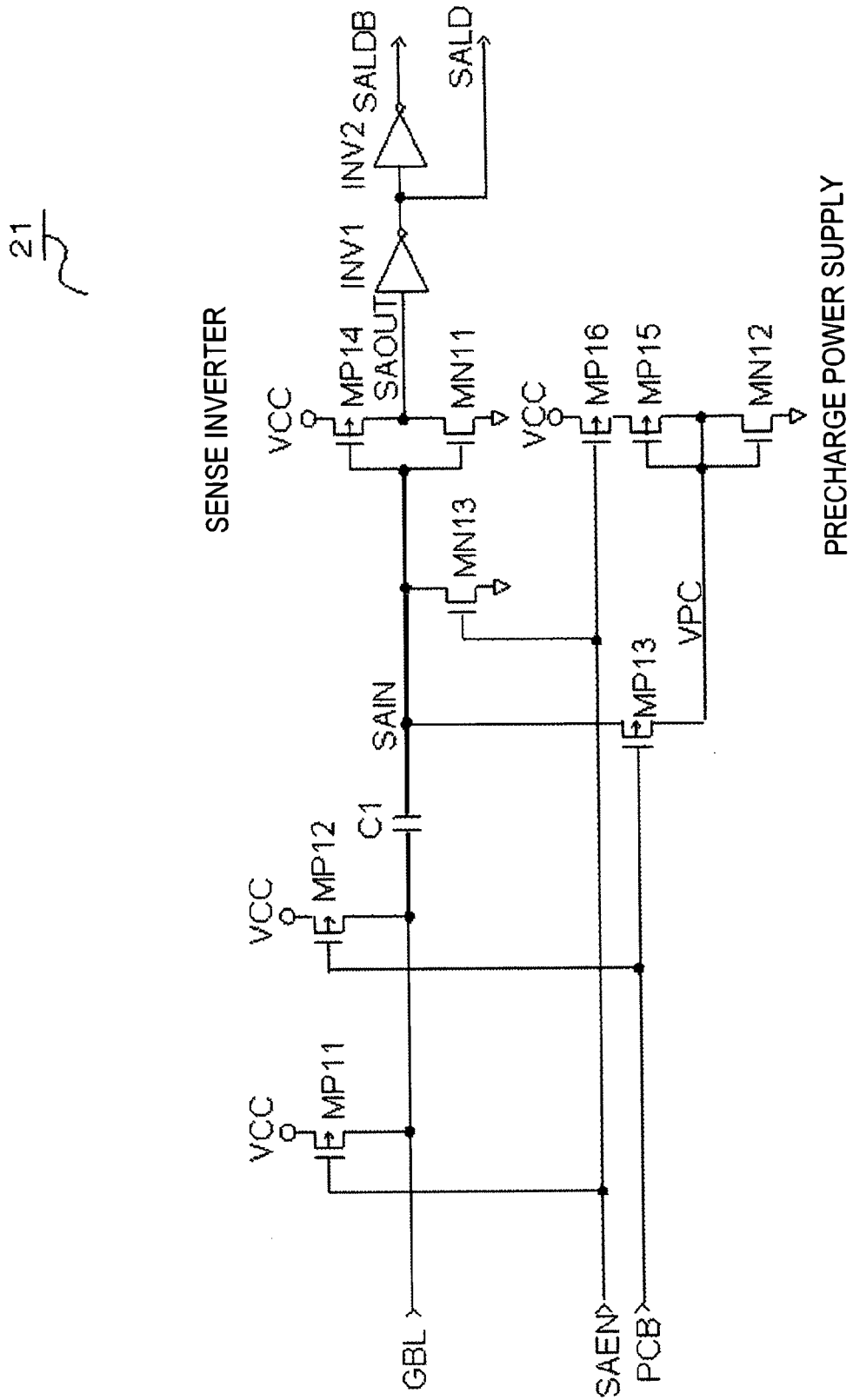
FIG. 2 is a circuit diagram of a sense amplifier according to the first exemplary embodiment of the present invention.

A detailed description is given below concerning the sense amplifier, which is a main part of the present invention. Here, the present invention is an invention related to a read mode, and a description is given below concerning content related to a read operation. FIG. 2 is a circuit diagram of the sense amplifier according to the first exemplary embodiment of the present invention. The sense amplifier circuit 21 is provided with NMOS transistors MN11 to MN13, PMOS transistors MP11 to MP16, a capacitor element C1, and inverter circuits INV1 and INV2.

The PMOS transistor MP11 has a source connected to a power supply VCC, a drain connected to the global bit line GBL, and a gate supplied with the activation signal SAEN, and when the activation signal SAEN goes to an L level, a current flows from the power supply VCC to the global bit line GBL. When the memory cell PC is in a reset state, that is, a state indicating a high resistance, the current is such that the potential of the global bit line GBL does not drop.

The PMOS transistor MP12 has a source connected to the power supply VCC, a drain connected to the global bit line GBL, and a gate supplied with the precharge signal PCB, and when the precharge signal PCB goes to an L level, the global bit line GBL is precharged to the potential of the power supply VCC.

Figure 3A:
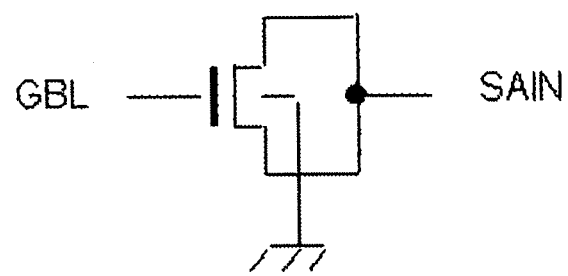
FIGS. 3A and 3B are circuit diagrams of a capacitor element according to the first exemplary embodiment of the present invention.
Figure 3B:
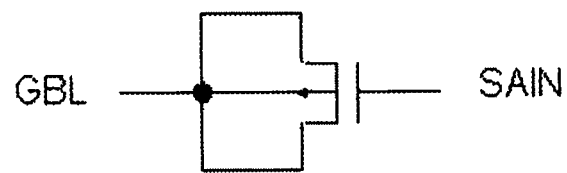

The capacitor element C1 is connected between the global bit line GBL and a terminal SAIN. FIGS. 3A and 3B are circuit diagrams of the capacitor element according to the first exemplary embodiment of the present invention. The capacitor element C1 forms an MOS transistor channel to configure a coupling capacitor. More specifically, as shown in FIG. 3A, the capacitor element is configured by a depression type NMOS, where a back gate is grounded, a gate is connected to a bit line GBL, a source and drain are commonly connected to the terminal SAIN, and, for example, a threshold Vth is of the order of −2 to −3V. Furthermore, as shown in FIG. 3B, a configuration is also possible with a PMOS transistor where a gate is connected to the terminal SAIN, a source, drain, and back gate are commonly connected to a bit line GBL, and, for example, a threshold Vth is a low Vth of the order of 0V.

The PMOS transistor MP13 has a drain connected to the terminal SAIN, a source connected to a terminal VPC, and a gate supplied with a precharge signal PCB, and when the precharge signal PCB goes to an L level, precharges a potential of the terminal SAIN, which is an internal decision point, to the potential of the terminal VPC.

The PMOS transistor MP14 has a source connected to the power supply VCC, a drain connected to a terminal SAOUT, and a gate connected to the terminal SAIN. The NMOS transistor MN11 has a source connected to ground, a drain connected to the terminal SAOUT, and a gate connected to the terminal SAIN, and forms a sense inverter with the PMOS transistor MP14. The sense inverter is an amplifier circuit that outputs at an L level to the terminal SAOUT in a case where the potential of the terminal SAIN is higher than a logic threshold, and outputs at a H level to the terminal SAOUT in a case where the potential of the terminal SAIN is lower than the logic threshold.

The terminal SAOUT, which is an output of the sense inverter, outputs a signal SALD via the inverter circuit INV1, and outputs a signal SALDB of reverse phase to the signal SALD via the inverter circuits INV1 and INV2.

The PMOS transistor MP16 has a source connected to the power supply VCC, a drain connected to the source of the PMOS transistor MP15, and a gate supplied with an activation signal SAEN, and activates the PMOS transistor MP15 and the NMOS transistor MN12 in a case where the activation signal SAEN goes to an L level. The PMOS transistor MP15 has a drain and gate connected to the terminal VPC. The NMOS transistor MP12 has a source connected to ground, and a drain and gate connected to the terminal VPC. A setting CMOS inverter circuit, which forms a precharge power supply, is configured as a potential setting circuit, by the PMOS transistor MP15 and the NMOS transistor MN12.

First, in the sense amplifier circuit 21, in amplifying read data, the signal PCB and the signal SAEN transition from H to L, the PMOS transistors MP11, MP12, and MP13 are turned ON, and the global bit line GBL and the terminal SAIN corresponding to this are precharged to respective potentials. The PMOS transistor MP11 makes a current flow to a selected phase change element RP, and causes a potential drop from a precharge potential, and the sense inverter judges whether a potential thereafter is higher or lower than a prescribed value (here, a sense inverter logic threshold).

In the abovementioned configuration, in a case where the PMOS transistor MP13 is ON, with regard to the precharge potential of the terminal SAIN, the potential of the terminal VPC between the PMOS transistor MP15 and the NMOS transistor MN12 formed by manufacturing method the same as for the PMOS transistor MP14 and the NMOS transistor MN11, is applied.

Here, the size of an MOS transistor X is expressed as S(X). In a case of a relationship of S(MP14)/S(MN11)=S(MP15)/S(MN12), the level of VPC is equal to a logic threshold of the sense inverter.

In contrast to this, by a configuration such that S(MP14)/S(MN11)<S(MP15)/S(MN12), a configuration is possible such that the level of VPC is always higher than the logic threshold of the sense inverter. For example, in a case where S(MN11)=S(MN 12), the size of MP15 may be larger than the size of MP14. It is to be noted that in a case of becoming too large, a state occurs where output data of the sense inverter cannot switch over, so that with the abovementioned ratio as, for example, S(MP14)/S(MN 11):S(MP15)/S(MN12)=1:4, VPC is preferably of the order of 0.4V, for example, higher than the logic threshold of the sense inverter. It is to be noted, as described later, that in order to enable reading at high speed in a case where the memory cell PC that is to be read is in a set state, the VPC is preferably in a range in which the sense inverter judges stably, and is as close as possible to the logic threshold of the sense inverter.

However, the precharge voltage of the global bit line GBL is at a level of the power supply VCC that is higher than VPC. Furthermore, the PMOS transistor MP11 supplies a constant current to the global bit line GBL with the sense amplifier in an activation state. When a word line SWL is selected, in accompaniment with this, a current path is formed via the memory cell PC between the global bit line GBL and ground VSS.

Here, in a case where the memory cell PC that is to be read is in a set state, that is, the phase change element RP is in a crystalline state, a resistance value of the memory cell PC is a relatively low resistance. Therefore, the potential of the global bit line GBL drops, irrespective of the current of the PMOS transistor MP11 that is ON. Accompanying this, the potential of the terminal SAIN, which is capacitance coupled with the capacitor element C1, drops. Therefore, the sense inverter compares the potential of the terminal SAIN with a logic threshold, judges it to be low (L level input), and outputs a signal at a H level to the terminal SAOUT.

With regard to this, in a case where the memory cell PC that is to be read is in a reset state, that is, the phase change element RP is in an amorphous state, a resistance value of the memory cell PC is a relatively high resistance. Therefore, the potential of the global bit line GBL receives a current source of the PMOS transistor MP11 that is ON, and maintains a precharge level, without dropping. Accompanying this, the potential of the terminal SAIN that is capacitance coupled with the capacitor element C1 does not drop, and the precharge level maintains a higher value than the logic threshold. Therefore, the sense inverter compares the potential of the terminal SAIN with the logic threshold, judges it to be high (H level input), and outputs a signal at an L level to the terminal SAOUT.

Figure 4:
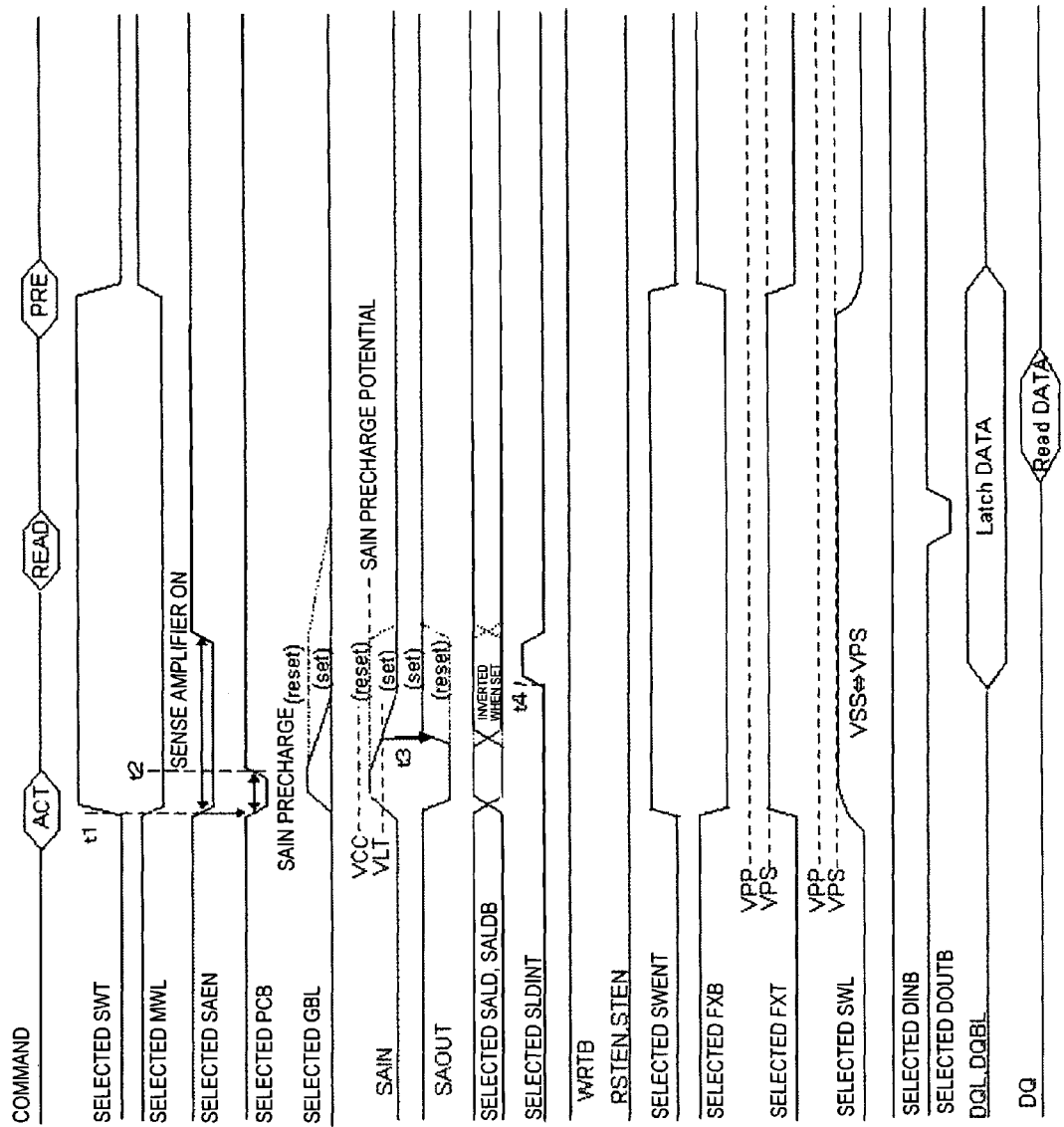
FIG. 4 is a timing chart expressing an operation of the semiconductor device according to the first exemplary embodiment of the present invention.

Next, a description is given concerning a read operation of the semiconductor device. FIG. 4 is a timing chart expressing an operation of the semiconductor device according to the first exemplary embodiment of the present invention. In FIG. 4, a signal represented by "selected . . ." relates to a memory cell that is to be read, and indicates a signal to be selected, among a plurality of signals.

When an ACT command is given as a command, selected SWT and selected MWL become active at timing t1. At the same time, SAEN=L, MP11 is ON, MN13 is OFF, and the sense inverter is in an activated state. Furthermore, with SAEN=L, MP16 is ON, and a precharge power supply formed from MP15 and MN12 is ON. Furthermore, PCB is L, in synchronization with SAEN=L. In this way, MP13 is ON and the terminal SAIN is precharged to a level of VCP. Here, the level of VCP is a potential higher than a logic threshold VLT of the sense inverter and lower than the power supply VCC. In addition, MP12 is ON, and GBP is precharged to VCC.

At timing t2 when SWL and SWT are fixed and the potential of SAIN is made stable by precharging, PCB is at a H level. The precharging of SAIN at PCB=H and the VCC precharge of GBL are finished. MP13 is OFF and SAIN holds the precharge potential.

In a case where a selected cell is in a set state, the potential of GBL drops according to memory cell current. SAIN is coupled with GBL and its potential gradually drops. At timing t3, when the potential at SAIN becomes lower than the logic threshold VLT of the sense inverter, SAOUT outputs at a H level. Against this, in a case where the selected cell is in a reset state, GBL holds the potential of the power supply VCC. SAIN holds the precharge potential, and SAOUT holds an L level.

At timing t4, with SLDINT=H, the write read latch circuit 23 latches SALD and SALDB. Thereafter, the write read latch circuit 23 outputs READ data to DQ, by a READ command.

In the above type of sense amplifier circuit 21, the potential of the terminal VPC of the precharge power supply formed from the PMOS transistor MP15 and the NMOS transistor MN12, and the logic threshold of the sense inverter formed from the PMOS transistor MP14 and the NMOS transistor MN11 change in the same way with respect to variation in operating environment of the semiconductor device. Therefore, the sense inverter can output normal read data stably. That is, even in a case where a logic threshold changes with variation in the operating environment of the semiconductor device, precharge potential follows accordingly, and it is possible to enlarge an operating range of a memory function.

Second Exemplary Embodiment

Figure 5:
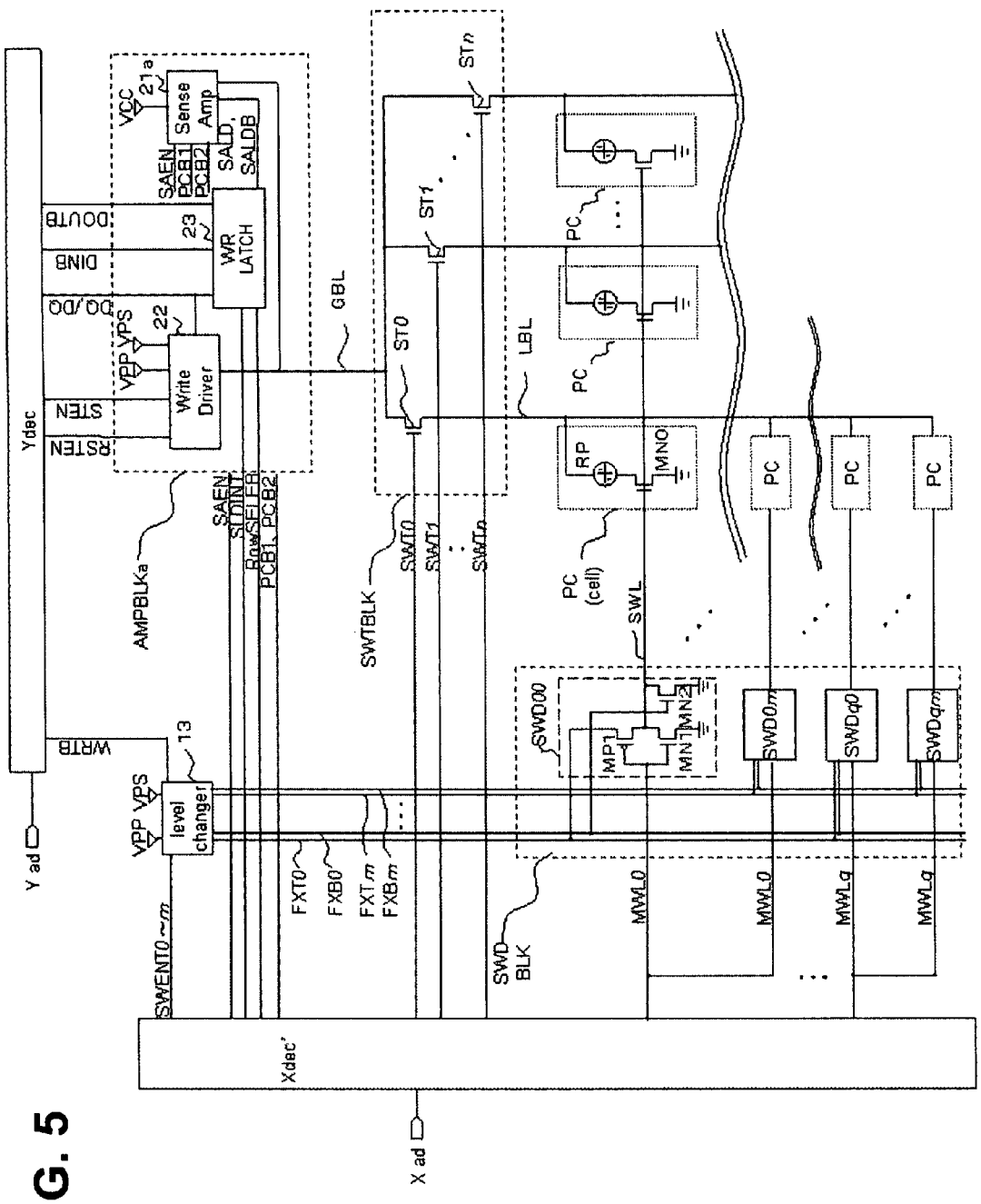
FIG. 5 is a block diagram showing a configuration of a semiconductor device according to a second exemplary embodiment of the present invention.

FIG. 5 is a block diagram showing a configuration of a semiconductor device according to a second exemplary embodiment of the present invention. In FIG. 5, reference symbols the same as FIG. 1 represent the same items, and descriptions thereof are omitted. In FIG. 5, an X decoder Xdec' receives and decodes a row address signal Xad, changes to precharge signals PCB, and outputs precharge signals PCB1 and PCB2 to a sense amplifier circuit 21a of an amplifier unit AMPBLK. The sense amplifier circuit 21a receives the precharge signal PCB1 and precharges a global bit line GBL, and receives the precharge signal PCB2 and sets a potential of an internal decision point (an input end of a sense inverter) to a desired value.

Figure 6:
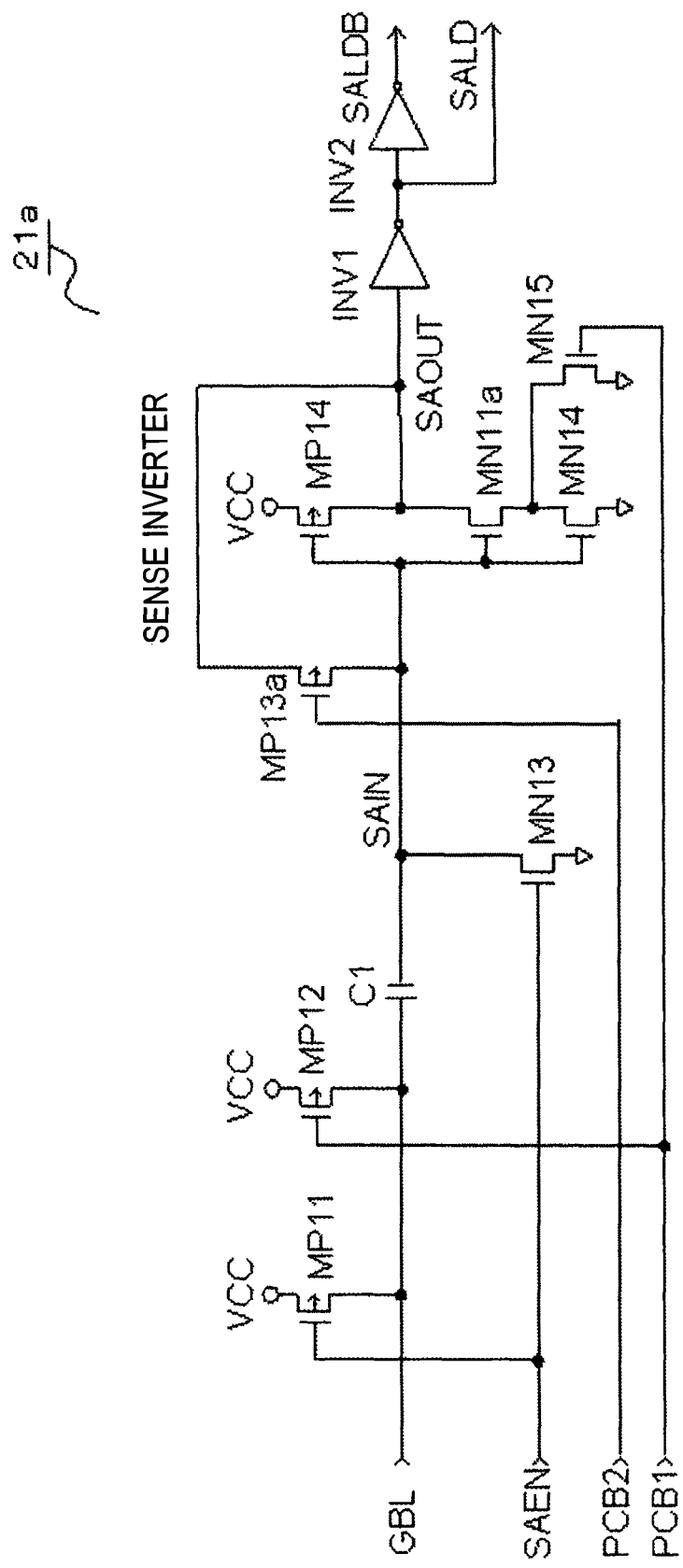
FIG. 6 is a circuit diagram of a sense amplifier according to the second exemplary embodiment of the present invention.

FIG. 6 is a circuit diagram of the sense amplifier according to the second exemplary embodiment of the present invention. In FIG. 6, reference symbols the same as FIG. 2 represent the same items, and descriptions thereof are omitted. The sense amplifier circuit 21a of FIG. 6 is functionally similar to the sense amplifier circuit 21 of FIG. 1. However, there is a difference in the point that a terminal SAIN is precharged using the sense inverter.

The sense amplifier circuit 21a differs from the sense amplifier circuit 21 of FIG. 1 by being provided with NMOS transistors MN11a, MN14, MN15 and a PMOS transistor MP14 forming the sense inverter, and a PMOS transistor MP13a enabling short circuiting between input and output of the sense inverter.

The NMOS transistor MN11a has a drain connected to a terminal SAOUT, a gate connected to a terminal SAIN, and a source connected to ground via the NMOS transistors MN14 and MN15. The NMOS transistor MN14 has a drain connected to the source of the NMOS transistor MN11a, a gate connected to a gate of the NMOS transistor MN11a, and a source connected to ground. The NMOS transistor MN15 has a drain connected to the source of the NMOS transistor MN11a, a gate supplied with the precharge signal PCB1, and a source connected to ground. The PMOS transistor MP13a has a source connected to the terminal SAOUT, a drain connected to the terminal SAIN, and a gate supplied with the precharge signal PCB2.

In the sense amplifier circuit 21a with the above type of configuration, when data is amplified, the precharge signals PCB1 and PCB2 go to a H level, MP13a is OFF, MN15 is ON, and the sense inverter is configured by MP14 and MN11a, to operate.

Against this, at a time of precharging, with regard to the sense amplifier circuit 21a, the precharge signals PCB1 and PCB2 go to an L level, MP13a is ON, MN15 is OFF, and in the sense inverter configured by MP14, MN11a, and MN14, the terminals SAIN and SAOUT, which are input output terminals, are short circuited. In this case, since MN15 is OFF, the potential of the terminal SAIN has a potential higher by a voltage drop of MN14, with respect to a logic threshold of the sense inverter in a case where MN15 is ON. That is, a potential higher than the logic threshold at a time of amplification is generated at the terminal SAOUT at a time of precharging, and the terminal SAIN is precharged. In other respects, the second exemplary embodiment is similar to the first exemplary embodiment.

Figure 7:
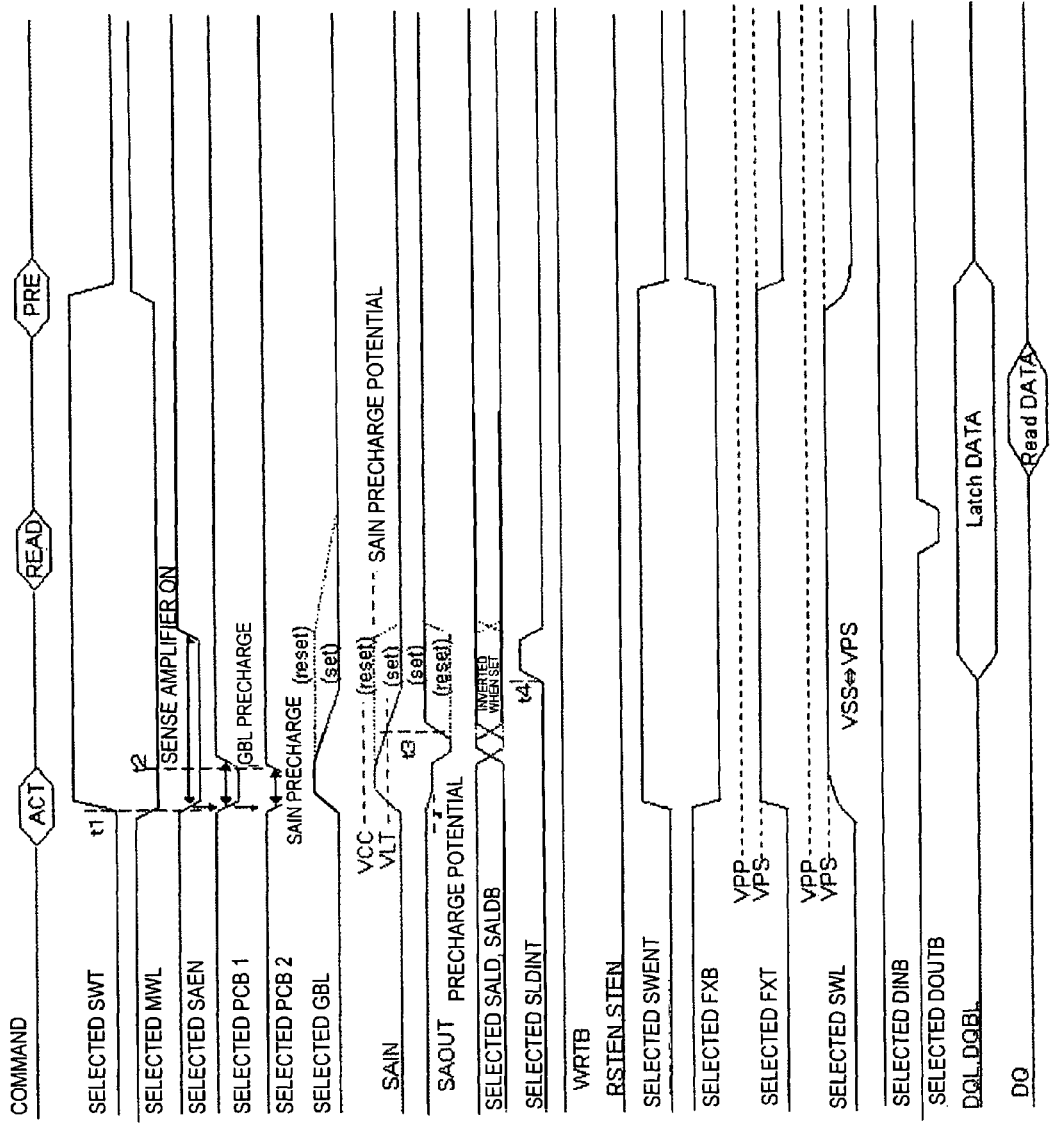
FIG. 7 is a timing chart expressing an operation of the semiconductor device according to the second exemplary embodiment of the present invention.

FIG. 7 is a timing chart expressing an operation of the semiconductor device according to the second exemplary embodiment of the present invention. In FIG. 7, portions for which there is no particular description are the same as FIG. 4.

When an ACT command is given as a command, selected SWT and selected MWL become active at timing t1. At the same time, SAEN=L, MP11 is ON, MN13 is OFF, and the sense inverter is in an activated state. Furthermore, PCB1 and PCB2 are L, in synchronization with SAEN=L. At PCB1=L, MP12 is ON, and GBL is precharged to VCC. At the same time, MN15 is OFF, and the precharge potential of the sense inverter is set to be high (higher than a logic threshold VLT). MP13a is ON at PCB2=L, and in this way SAIN is shorted with SAOUT, and SAIN is precharged to a potential higher than the logic threshold VLT.

At timing t2 when SWL and SWT are fixed and the potential of SAIN is made stable, PCB2 is at H, and precharging of SAID is finished. SAIN holds the precharge potential. Next, with PCB1=H, MP12 is OFF, and VCC precharge of GBL is finished. Furthermore, MN15 is ON, and a threshold of the sense inverter becomes low. On receiving this, SAOUT outputs at L.

In a case where a selected cell is in a set state, the potential of GBL drops according to memory cell current. SAIN is coupled to GBL and its potential gradually drops. At timing t3, when the potential at SAIN becomes lower than VLT of the sense inverter, SAOUT outputs at a H level. Against this, in a case where the selected cell is in a reset state, GBL holds the potential of VCC. SAIN holds the precharge potential, and SAOUT holds an L level.

At timing t4, with SLDINT=H, the write read latch circuit 23 latches SALD and SALDB. By a READ command, the write read latch circuit 23 outputs READ data to DQ.

In the above type of sense amplifier circuit 21a, the potential of the terminal SAIN at a time of precharging and a logic threshold of the sense inverter formed from the PMOS transistor MP14 and the NMOS transistor MN11a change in the same way, with respect to variation in operating environment of the semiconductor device. Therefore, even in a case where a logic threshold changes with variation in the operating environment of the semiconductor device similar to the first exemplary embodiment, precharge potential follows accordingly, and it is possible to enlarge an operating range of the memory function.

It is to be noted that the disclosure of the abovementioned patent document is incorporated herein by reference thereto. Modifications and adjustments of embodiments and examples are possible within the bounds of the entire disclosure (including the scope of the claims) of the present invention, and also based on fundamental technological concepts thereof. Furthermore, a wide variety of combinations and selections of various disclosed elements is possible within the scope of the claims of the present invention. That is, the present invention clearly includes every type of transformation and modification that a person skilled in the art can realize according to the entire disclosure including the scope of the claims and to technological concepts thereof.

In the present disclosure, further modes are possible as mentioned below.

(Mode 1)

A semiconductor device comprising: a memory cell array where memory cells configured to include a resistance change element are disposed in matrix form, a bit line commonly connected to one end of a plurality of the memory cells in a column direction of the memory cell array, and a sense amplifier that precharges the bit line, determines a potential at a decision point linked to a potential of the bit line that changes according to a state of a memory cell after a prescribed time has passed from ending precharging, and outputs output data expressing whether or not the potential of the decision point is greater than or equal to a decision threshold, wherein the sense amplifier sets the potential of the decision point in correspondence with the decision threshold in a case where the bit line is precharged.

(Mode 2)

The semiconductor device according to mode 1, wherein the sense amplifier comprises: a precharge circuit that precharges the bit line, an output circuit that outputs output data after a prescribed time has passed from ending the precharging, a capacitor element that is connected between the bit line and an input end of the output circuit, and a potential setting circuit that enables setting the input end of the output circuit to a prescribed potential between a precharge voltage of the bit line and the decision threshold, at a time of precharging the bit line, and wherein the decision point is the input end of the output circuit to which one end of the capacitor element is connected.

(Mode 3)

The semiconductor device according to mode 2, wherein the decision threshold is a logic threshold at the input end of the output circuit.

(Mode 4)

The semiconductor device according to mode 3, wherein the output circuit includes an output CMOS inverter circuit, and the input end of the output circuit is an input end of the output CMOS inverter circuit.

(Mode 5)

The semiconductor device according to mode 2, wherein the potential setting circuit comprises a switch circuit that is ON at a time of precharging the bit line, enabling a supply of the prescribed potential to the input end of the output circuit, and .is OFF after the precharging of the bit line is ended.

(Mode 6)

The semiconductor device according to mode 4, wherein the potential setting circuit comprises a setting CMOS inverter circuit that outputs a prescribed potential from an output end, and also connects an input end and the output end, and wherein a ratio of the size of an NMOS transistor in the output CMOS inverter circuit with respect to the size of a PMOS transistor in the output CMOS inverter circuit, is smaller than a ratio of the size of an NMOS transistor in the setting CMOS inverter circuit with respect to the size of a PMOS transistor in the setting CMOS inverter circuit.

(Mode 7)

The semiconductor device according to mode 4, wherein the output circuit comprises first and second NMOS transistors connected in parallel between a ground side of the output CMOS inverter circuit and ground, a gate of the first NMOS transistor is connected to an input end of the output CMOS inverter circuit, and the second NMOS transistor is OFF at a time of precharging the bit line; and the potential setting circuit is configured as the output CMOS inverter circuit that makes a short circuit between an input end and an output end at a time of precharging the bit line, to have the input end at the prescribed potential.

(Mode 8)

A method as set forth as the fourth aspect.

(Mode 9)

The method according to mode 8, wherein the first node is caused to change from the initial potential to the second potential by capacitively coupling between the first and second nodes.

(Mode 10)

The method according to mode 8, wherein each of the initial and reference potentials is set in relation to both of threshold potentials of n-type and p-type transistors.

(Mode 11)

The method according to mode 8, further comprising: setting the second node at another initial potential different from the initial potential of the first node before driving the second node.

(Mode 12)

The method according to mode 8, further comprising: accessing a memory cell to produce the first signal.

(Mode 13)

The method according to mode 12, wherein the memory cell includes a resistive memory element.

(Mode 14)

The method according to mode 12, wherein the memory cell includes a phase change element.

What is claimed is:

1. A semiconductor device, comprising:
   a memory cell;
   a first line coupled to the memory cell;
   a first terminal electrically coupled to the first line;
   a second terminal; and
   a sense amplifier circuit including first and second transistors, gates of the first and second transistors being coupled in common to the first terminal, one of a source and a drain of the first transistor and one of a source and a drain of the second transistor being coupled in common to the second terminal,
   the first terminal being configured to be supplied with a precharge potential, a level of the precharge potential being determined based on both first and second levels, the first level being related to a first threshold voltage of the first transistor, and the second level being related to a second threshold voltage of the second transistor.

2. The semiconductor device as claimed in claim 1, wherein a potential of the second terminal is pulled up by the first transistor when a potential of the first terminal is lower than a sense threshold potential and pulled down by the second transistor when the potential of the first terminal is greater than the sense threshold potential, the precharge potential being greater than the sense threshold potential.

3. The semiconductor device as claimed in claim 1, wherein the first and second transistors are different in conductivity type from each other.

4. The semiconductor device as claimed in claim 2, wherein the potential of the first terminal changes from the precharge potential to a potential lower than the sense threshold potential when the memory cell takes a first state.

5. The semiconductor device as claimed in claim 4, wherein the potential of the first terminal does not change from the precharge potential to the potential lower than the sense threshold potential when the memory cell takes a second state.

6. The semiconductor device as claimed in claim 5, wherein the potential of the first terminal substantially maintains the precharge potential when the memory cell takes the second state.

7. The semiconductor device as claimed in claim 5, wherein the memory cell comprises a phase change material, the first state corresponding to a crystalline state of the phase change material, and the second state corresponding to an amorphous state of the phase change material.

8. The semiconductor device as claimed in claim 1, further comprising third and fourth terminals and a precharge potential generator generating the precharge potential, the precharge potential generator including third and fourth transistors, gates of the third and fourth transistors being coupled in common to the third terminal, ones of a source and a drain of the third and fourth transistors being coupled in common to the fourth terminal, and the third and fourth terminals being coupled to each other.

9. The semiconductor device as claimed in claim 8, wherein a third threshold voltage of the third transistor is substantially equal to the first threshold voltage and a fourth threshold voltage of the fourth transistor is substantially equal to the second threshold voltage.

10. The semiconductor device as claimed in claim 8, wherein a first ratio of a size of the third transistor to a size of the fourth transistor is different from a second ratio of a size of the first transistor to a size of the second transistor.

11. The semiconductor device as claimed in claim 10, wherein the first ratio is greater than the second ratio.

12. The semiconductor device as claimed in claim 1, further comprising a capacitor, one node of the capacitor being coupled to the first line and an other node of the capacitor being coupled to the first terminal.

13. The semiconductor device as claimed in claim 12, further comprising a fifth transistor coupled between the first and third terminals.

14. The semiconductor device as claimed in claim 13, further comprising a sixth transistor coupled between the first line and a voltage terminal, a potential of the voltage terminal being greater than the precharge potential.

15. The semiconductor device as claimed in claim 1, further comprising a seventh transistor coupled between the first and second terminals, the first and second transistors being configured to generate the precharge potential at the second terminal when the seventh transistor turns on, and the first terminal being configured to be supplied with the precharge potential from the second terminal when the seventh transistor turns on.

16. The semiconductor device as claimed in claim 15, further comprising first and second voltage terminals and an eighth transistor, the first transistor being coupled between the first voltage terminal and the second terminal, the second transistor coupled between the second voltage terminal and the second terminal, and the eighth transistor being coupled between the second voltage terminal and the second terminal in parallel to the second transistor.

17. The semiconductor device as claimed in claim 16, wherein the first terminal is configured to be supplied with the precharge potential when the eighth transistor is in an off-state.

18. The semiconductor device as claimed in claim 17, further comprising a capacitor, one node of the capacitor being coupled to the first line and an other node of the capacitor being coupled to the first terminal.

19. The semiconductor device as claimed in claim 18, further comprising a ninth transistor coupled between the first line and the first voltage terminal, a potential of the first voltage terminal being greater than the precharge potential.

20. The semiconductor device as claimed in claim 19, wherein gates of the eighth and ninth transistors are coupled in common to each other.

* * * * *